United States Patent
Lien et al.

[19]

[11] Patent Number: 6,008,075
[45] Date of Patent: Dec. 28, 1999

[54] METHOD FOR SIMULTANEOUS FORMATION OF CONTACTS BETWEEN METAL LAYERS AND FUSE WINDOWS IN SEMICONDUCTOR MANUFACTURING

[75] Inventors: Wah-Yih Lien; Ing-Ruey Liaw, both of Hsinchu, Taiwan

[73] Assignee: Vanguard International Semiconductor Corporation, Hsin-Chu, Taiwan

[21] Appl. No.: 09/247,976

[22] Filed: Feb. 11, 1999

[51] Int. Cl.[6] .................................................. H01L 21/82
[52] U.S. Cl. ........................ 438/132; 644/636; 644/648
[58] Field of Search .................................. 438/132, 638, 438/639, 643, 644, 648, 636, 653, 654, 656, 661, 662, 685, 700; 257/529

[56] References Cited

U.S. PATENT DOCUMENTS

| | | | |
|---|---|---|---|
| 5,472,901 | 12/1995 | Kapoor | 437/60 |
| 5,534,461 | 7/1996 | Kuwajima | 438/645 |
| 5,618,750 | 4/1997 | Fukuhara et al. | 438/601 |
| 5,736,433 | 4/1998 | Bryant et al. | 438/132 |
| 5,753,539 | 5/1998 | Okazaki | 438/132 |
| 5,760,453 | 6/1998 | Chen | 257/529 |
| 5,827,759 | 10/1998 | Froehner | 438/601 |
| 5,844,295 | 12/1998 | Tsukude et al. | 257/529 |
| 5,851,903 | 12/1998 | Stamper | 438/467 |
| 5,879,966 | 3/1999 | Lee et al. | 438/132 |

*Primary Examiner*—Tuan H. Nguyen
*Attorney, Agent, or Firm*—George O. Saile; Stephen B. Ackerman; William B. Stoffel

[57] ABSTRACT

A method for simultaneous fabrication of an interlever metal contact and a fuse window reducing the number of masking steps required while providing a high yield for the fuse. A semiconductor substrate is provided having a device area with a first metal layer over an InterLevel Dielectric layer and a fuse area with a polysilicon fuse buried within the InterLevel Dielectric layer. A thick anti-reflective coating is formed on the first metal layer. The first metal layer and the anti-reflective coating are patterned to form a first metal line. An InterMetal Dielectric layer is formed over the InterLevel Dielectric layer and the first metal line. The InterMetal Dielectric layer, the InterLevel Dielectric layer, and the anti-reflective coating are patterned, simultaneously opening a via hole extending partially into the anti-reflective coating and a fuse window opening extending into the InterLevel Dielectric layer without exposing the fuse. An adhesion layer is formed over the InterMetal Dielectric layer. A Tungsten layer is blanket deposited on the adhesion layer and anisotropically etched, forming a W-plug in the via hole and a W-ring on the sidewalls of the fuse window opening. An upper metal layer is formed on the adhesion layer, the W-plug, and the W-ring and patterned to form an upper metal line. This etch also forms an upper metal ring on the inside wall of the W-ring. A passivation layer and a dielectric layer are formed and patterned to extend the fuse window opening through the passivation layer without exposing the fuse.

18 Claims, 4 Drawing Sheets

METHOD FOR SIMULTANEOUS FORMATION OF CONTACTS BETWEEN METAL LAYERS AND FUSE WINDOWS IN SEMICONDUCTOR MANUFACTURING

BACKGROUND OF INVENTION

1. Field of the Invention

This invention relates generally to fabrication of semiconductor devices and more particularly to the simultaneous fabrication of contacts between metal layers and fuse windows reducing masking steps.

2. Description of the Prior Art

Fuses have been employed in semiconductor circuits to allow programming of the operation thereof after one or more processing operations. In some semiconductor circuits, such as DRAMS, redundant circuitry is placed into the chip in a short circuit mode connected by fuses. Then, after testing, redundant bits are programmed to replace "faulty" bits. This programming is accomplished by blowing the fuses for the unwanted connections, typically with a laser.

Some semiconductor devices, such as DRAMS require fuses and interlayer metal contacts. The conventional approach to fabricating fuses and interlevel metal contacts on the same chip requires one mask for etching the via for the interlayer metal contact plus three masks to open the fuse window: (1) etching the interlevel dielectric and intermetal dielectric above the fuse; (2) etching the passivation layer; and (3) opening the polyimide. Multiple masking steps increase processing complexity, add additional alignment tolerances and increase processing time.

The inventors have determined that it would be desirable to simultaneously etch the via and the fuse window. However, the inventors have determined that in order to form a good contact between the lower metal layer (M1) and the upper level metal (M2) in the via, an overetch is required. This overetch reduces the thickness of the interlevel dielectric remaining over the fuse, causing a high rate of fuse failure during a subsequent etch of M2.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,472,901 (Kapoor) teaches a method for forming horizontal fuses in the same deposition step as contacts.

U.S. Pat. No. 5,753,539 (Okazaki) shows a method for forming fuse opening and contact opening using different opening diameters and microloading effects.

U.S. Pat. No. 5,618,750 (Fukuhara) discloses a method for forming fuse openings.

U.S. Pat. No. 5,760,453 (Chen) shows a method for forming a fuse window and an overlying moisture barrier.

SUMMARY OF THE INVENTION

It is an object of the present invention to provide a method for simultaneous formation of interlevel metal contacts and fuse windows reducing the total number of masking steps.

It is another object of the present invention to provide a method for simultaneous formation of interlevel metal contacts and fuse windows with a low contact resistance.

It is another object of the present invention to provide a method for simultaneous formation of interlevel metal contacts and fuse windows with a high yield of fuses.

It is yet another object of the present invention to provide a robust and economical method for simultaneous fabrication of interlevel metal contacts and fuse windows.

To accomplish the above objectives, the present invention provides a method for simultaneous fabrication of interlevel contacts and fuse windows, eliminating two masking steps without damaging the fuse.

A semiconductor substrate (11) is provided having a device area (13) with a first metal layer (12) over an InterLevel Dielectric layer (14) and a fuse area (17) with a polysilicon fuse (16) buried within the InterLevel Dielectric layer (14). A thick anti-reflective coating (18) is formed on the first metal layer (12). The first metal layer (12) and the anti-reflective coating (18) are patterned to form a first metal line (12A, 18A). An InterMetal Dielectric layer (20) is formed over the InterLevel Dielectric layer (14) and the first metal line (12A, 18A). The InterMetal Dielectric layer (20), the InterLevel Dielectric layer (14), and the anti-reflective coating (18) are patterned, simultaneously opening a via hole (22) extending partially into the anti-reflective coating (18) and a fuse window opening (24) extending into the InterLevel Dielectric layer (14) without exposing the fuse (16). An adhesion layer (26) is formed over the InterMetal Dielectric layer (20). A Tungsten layer (28) is blanket deposited on the adhesion layer (26) and anisotropically etched, forming a W-plug (28A) in the via hole (22) and a W-ring (28B) on the sidewalls of the fuse window opening (24). An upper metal layer (30) is formed on the adhesion layer (26), the W-plug (28A), and the W-ring (28B) and patterned to form an upper metal line (34A). This etch also forms an upper metal ring (34B) on the inside wall of the W-ring (28B). A passivation layer (32) and a dielectric layer (38) are formed and patterned to extend the fuse window opening (24) through the passivation layer (36) without exposing the fuse (16).

The present invention provides considerable improvement over the prior art by eliminating two masking steps required to open a via hole and to form a fuse window. Since masking steps add cycle time, complexity and alignment tolerances to the process, it is benificial to reduce the total number of masking steps. This reduction is possible because the present invention controls the depths of the overetches during via hole etch and during upper metal layer etch. The via hole etch is controlled because of increased anti-reflective coating thickness and the capability of using the TiN anti-reflective coating as part of the contact. The upper metal layer etch is controlled by the W-plug process because the adhesion layer acts as an etch stop.

Also, the W-plug process can easily be used to obtain a low Rc. TiN to W contact and circuitry metals such as Al—Cu to W contact are known to provide low Rc values.

The remaining W-ring and upper metal ring on the walls of the fuse window opening also provide a good moisture barrier for the neighboring circuitry enhancing the reliability of the chip function.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for simultaneous fabrication of interlayer contacts and fuse windows, reducing the total number of masking steps with high fuse yield.

Figure 1:
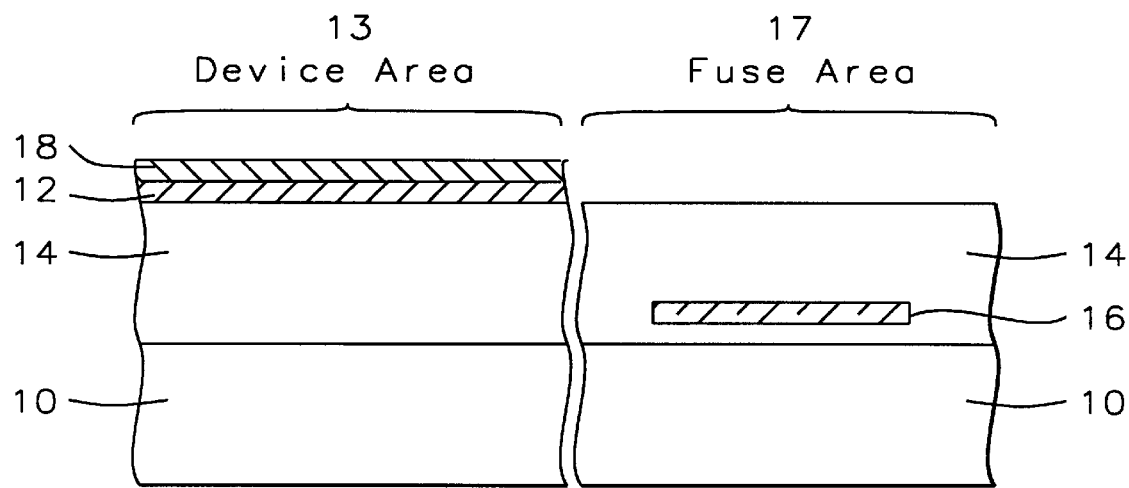
FIGS. 1, 2, 3, 4, 5, 6 & 7 illustrate sequential sectional views of a process for simultaneous formation of an interlevel metal contact and a fuse window according to the present invention.

Referring to FIG. 1, a semiconductor substrate (11) is provided that has already undergone some processing. The substrate comprises a device area (13) and a fuse area (17). Within the device area (13), a first metal layer (12) overlies an InterLevel Dielectric layer (14). Within the fuse area (17) a polysilicon fuse (16) is buried within the InterLevel Dielectric layer (14). The polysilicon fuse is preferably buried within said InterLevel Dielectric Layer at a depth of between about 1 $\mu$m and 2 $\mu$m. The metal layer is preferably an Al—Cu alloy. However, other metals such as Cu or W can be used. Those skilled in the art will recognize that this configuration is conventional for DRAMs.

Still referring to FIG. 1, an anti-reflective coating (18) is formed on the first metal layer (12). The anti-reflective coating (18) can be composed of TaN, WN, or most preferably TiN, and can be formed to a thickness in the range between about 1000 Å and 1500 Å. It can be formed by sputtering or reactive sputtering.

A key advantage of the present invention is that the thick TiN anti-reflective coating requires less of an overetch than a conventional thinner anti-reflective coating. Because less overetch is used, less of the Interlevel Dielectric layer is removed in the fuse area (17).

Figure 2:
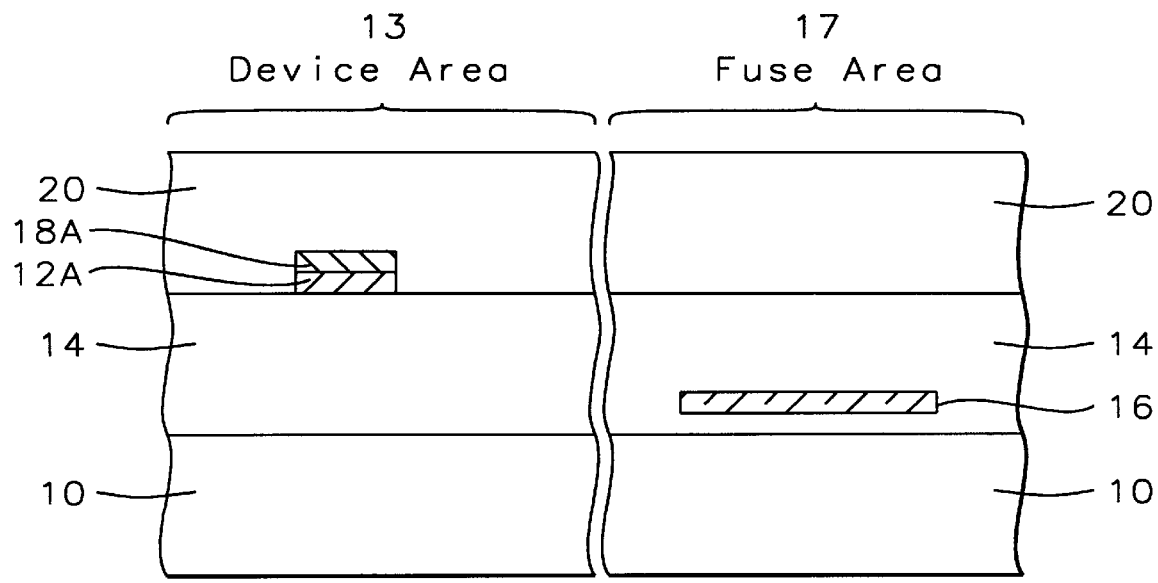

Referring to FIG. 2, the first metal layer (12) and the anti-reflective coating (18) are patterned using conventional photolithography techniques to form a first metal line (12A, 18A). Next, an InterMetal Dielectric layer (20) is formed over the InterLevel Dielectric layer (14) and the first metal line (12A, 18A). The InterMetal Dielectric layer (20) is preferrably composed of silicon dioxide having a thickness in the range between 5,000 Å and 10,000 Å. The InterMetal Dielectric layer (20) can be formed by various processes that are known in the art, such as reacting Silane and Oxygen at temperatures below 500° C., or by decomposing tetraethoxysilane (TEOS) at a temperature of between about 650° C. and 750° C. in a low pressure chemical vapor deposition reactor.

Figure 3:
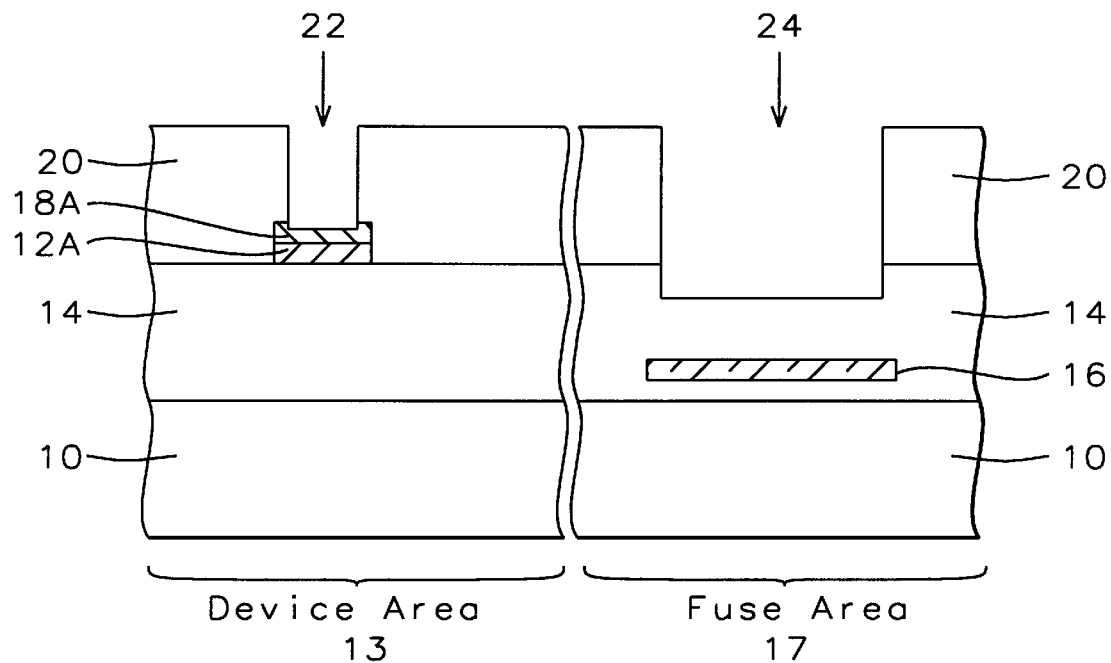

Referring to FIG. 3, in a key step, the InterMetal Dielectric layer (20), the InterLevel Dielectric layer (14), and the anti-reflective coating (18) are simultaneously patterned. In the device area (13), a via hole (22) is formed in the InterMetal dielectric layer (20) using an overetch so that the via hole (22) extends into but not through the anti-reflective coating (18). In the fuse area (17), a fuse window opening (24) is formed in the InterMetal Dielectric layer (20), extending into the InterLevel Dielectric layer (14) but not exposing the polysilicon fuse (16). The patterning preferably comprises a dry oxide etch step. The etch is preferably controlled to penetrate the anti-reflective coating to a depth in the range between about 50 Å and 200 Å and to penetrate the InterLevel Dielectric layer (14) in the fuse area so that the remaining InterLevel Dielectric layer (14) in the fuse area has a depth in the range between about 2000 Å and 4000 Å. The fuse window opening (24) has sidewalls. The via hole (22) preferably has a width in the range between 0.3 $\mu$m and 1 $\mu$m, and the fuse window opening (24) preferably has a width in the range between 10 $\mu$m and 20 $\mu$m.

Figure 4:
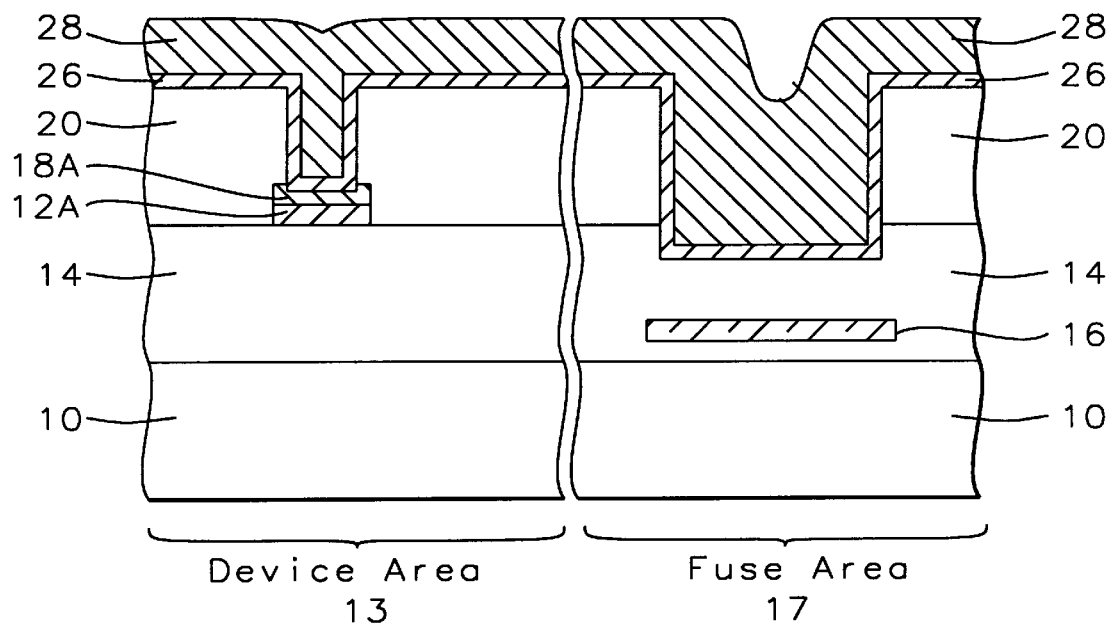

Referring to FIG. 4, an adhesion layer (26) is formed over the InterMetal Dielectric layer (20), the anti-reflective coating (22) and the InterLevel Dielectric layer (14). The adhesion layer (26) is preferably composed of TiN having a thickness in the range between 500 Å and 1000 Å. The adhesive layer can be formed by sputtering or reactive sputtering.

Still referring to FIG. 4, a Tungsten layer (28) is banket deposited on the adhesion layer (26). The Tungsten layer (28) is preferably formed to a thickness in the range between 5,000 Å and 10,000 Å using an evaporation, sputtering or chemical vapor deposition process.

Figure 5:
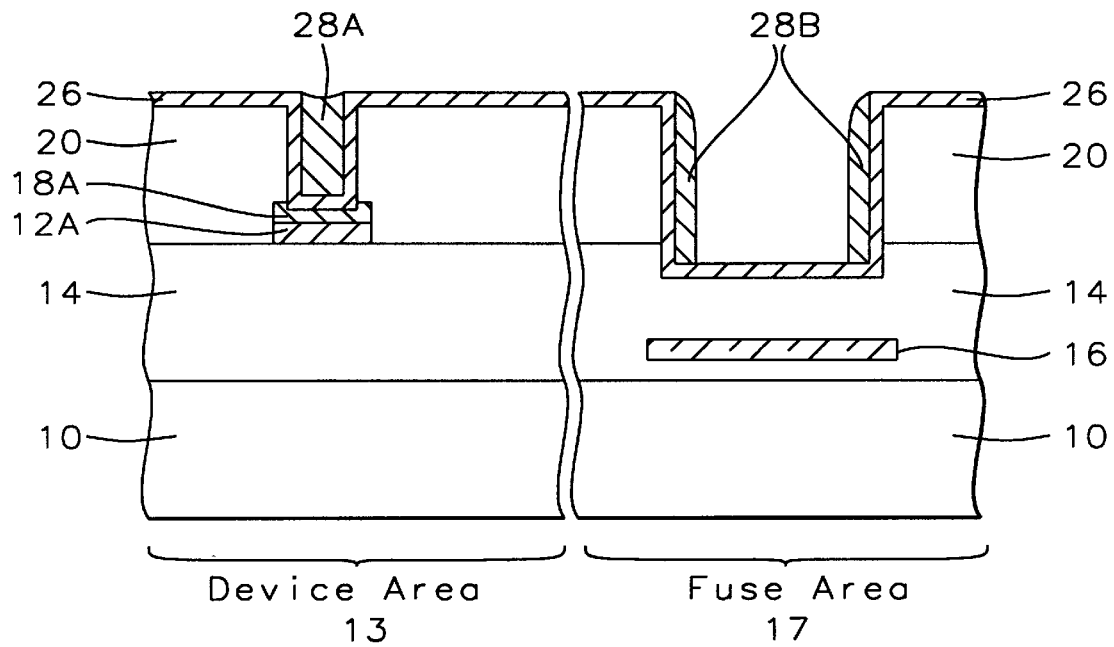

Referring to FIG. 5, the Tungsten layer (28) is anisotropically etched. The Tungsten can be etched using a Fluorinated gas using the adhesion layer (26) as an etch stop. A W-plug (28A) is left in the via hole (22). Because of the width of the fuse window opening (24), the anisotropic etch leaves a W-ring (28B) on the sidewalls of the fuse window opening (24). The W-ring (28B) preferably has a thickness in the range between 50 Å and 1000 Å.

Figure 6:
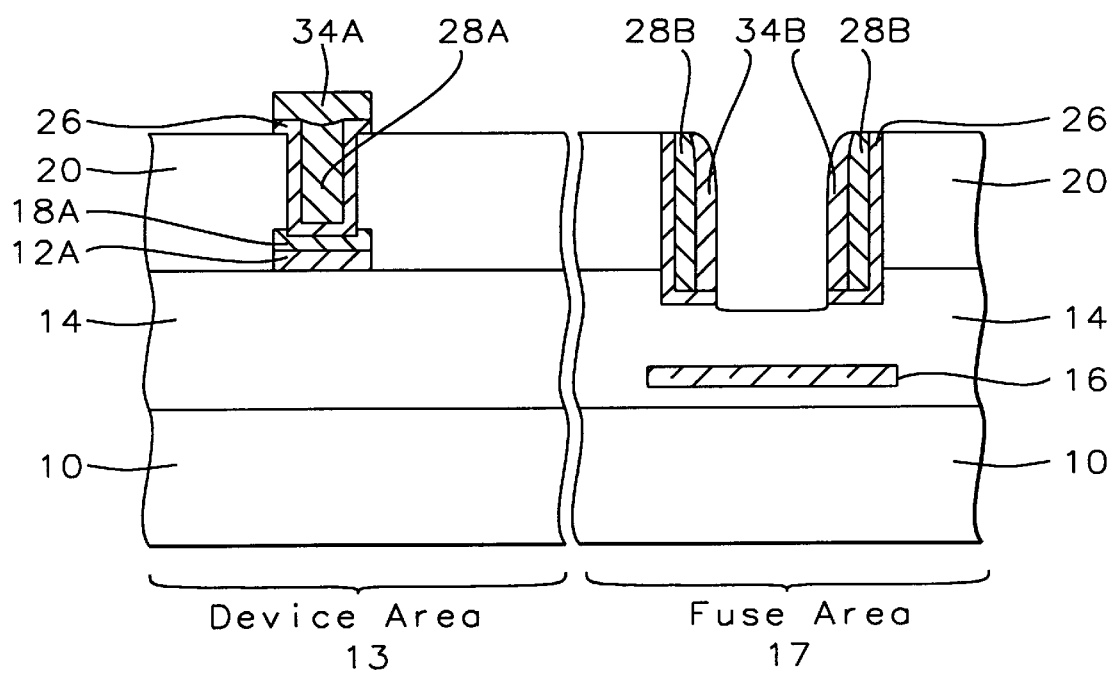

Referring to FIG. 6, an upper metal layer is formed on the adhesion layer (26), on the W-plug (28B), and on the W-ring (28A). The upper metal layer can be composed of TaW, WN, or most preferably Ti or TiN. The upper metal layer (30) is preferably formed to a thickness in the range between about 1000 Å and 5000 Å using an evaporation or a sputtering pocess.

Still referring to FIG. 6, the upper metal layer and the adhesin layer (26) are patterned to form an upper metal line (34A) contacting the W-plug (28A). The upper metal layer and adhesion layer (26) are patterned using a dry, anisotropic etch forming an upper metal ring (34B) inside of and concentric to the W-ring (28B) in the fuse window opening (24). The anisotropic etch can use $CCl_4$, $Cl_2$, $BCl_3$ or a combination thereof as a source gas. The etch is controlled to leave a thickness of the InterLevel Dielectric layer (14) between the fuse window opening (24) and the polysilicon fuse (16). The remaining thickness of the Interlevel Dielectric layer (14) in the fuse area (17) is preferably in the range between 0 and 2000 Å.

Figure 7:
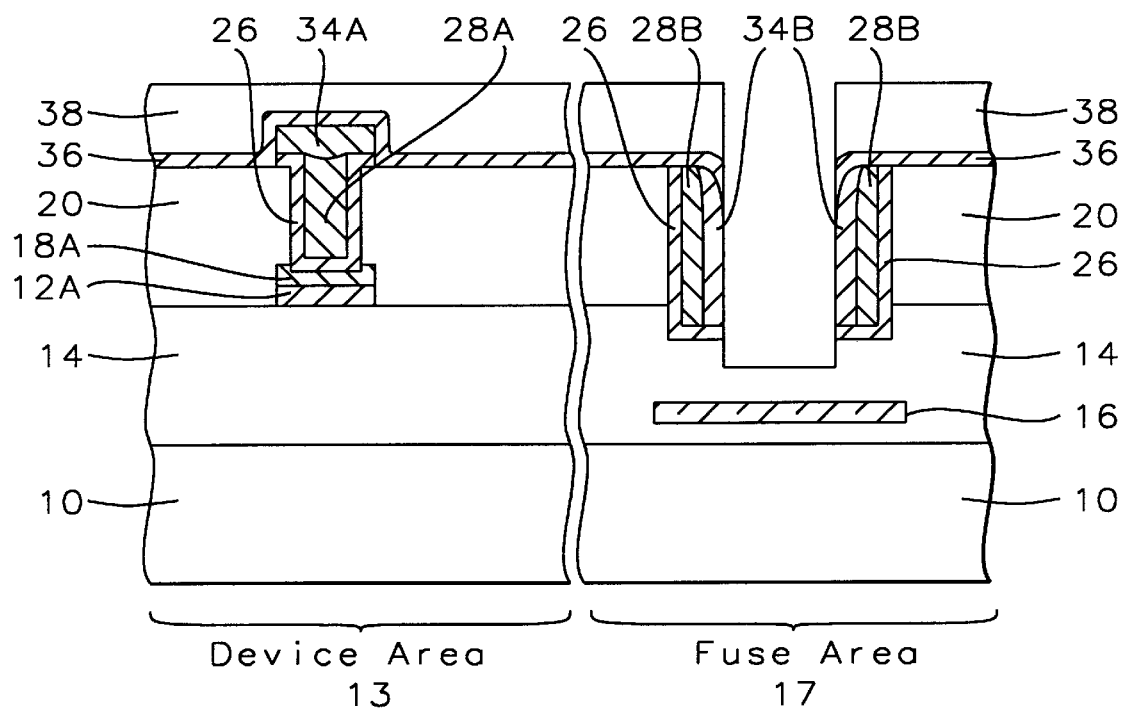

Referring to FIG. 7, a passivation layer (32) is formed over the upper metal line (34), the InterMetal Dielectric layer (20), and the InterLevel Dielectric layer (14). The passivation layer (32) is preferably composed of silicon nitride formed to a thickness in the range between 4000 Å and 8000 Å.

Still referring to FIG. 7, a dielectric layer (38) is formed on the passivation layer (36). The dielectric layer (38) is preferably composed of polyimide; formed by spinning the polyimide onto the substrate, then curing it at a temperature of between about 300° C. and 350° C.

The dielectric layer (38) and the passivation layer (36) are patterned using photolithography, extending the fuse window opening (24) through the passivation layer (36). The polyimide dielectric layer (38) can be patterned by exposure and development. The passivation layer can be etched using $CH_2F_2$, $CH_3F$, or most preferably $CHF_3$ as a source gas. The polyimide dielectric layer (38) can be left in place as a dielectric.

While the invention has been particularly shown and described with reference to the preferred embodiments thereof, it will be understood by those skilled in the art that various changes in form and details may be made without departing from the spirit and scope of the invention.

What is claimed is:

1. A method for simultaneous fabrication of an interlevel metal contact and a fuse window consisting of the steps of:

a) providing a semiconductor substrate having an InterLevel Dielectric layer; said substrate having a device area with a first metal layer over said InterLevel Dielectric layer and a fuse area with a polysilicon fuse buried within said InterLevel Dielectric layer;

b) forming an anti-reflective coating on said first metal layer;

c) patterning said first metal layer and said anti-reflective coating to form a first metal line;

d) forming an InterMetal Dielectric layer over said InterLevel Dielectric layer and said first metal line;

e) patterning said InterMetal Dielectric layer, said InterLevel Dielectric layer, and said anti-reflective coating to simultaneously open a via hole extending partially into the anti-reflective coating and a fuse window opening extending into said InterLevel Dielectric layer without exposing said fuse; said via hole and said fuse window having sidewalls and bottoms;

f) forming an adhesion layer over said InterMetal Dielectric layer, said anti-reflective coating, and said InterLevel Dielectric;

g) blanket depositing a Tungsten layer on said adhesion layer;

h) anisotropically etching said Tungsten layer; said etch stopping on said adhesion layer; thereby forming a W-plug in said via hole and a W-ring on said sidewalls of said fuse window opening; said W-ring having an inside wall;

i) forming an upper metal layer on said adhesion layer, said W-plug, and said W-ring;

j) patterning said upper metal layer using an anisotropic etch to form a upper metal line contacting said W-plug; said anisotropic etch forming an upper metal ring on said inside wall of said W-ring; whereby said upper metal ring and said W-ring form a moisture barrier guard ring;

k) forming a passivation layer over said upper metal layer, said InterMetal Dielectric layer, and said InterLevel Dielectric layer;

l) forming a dielectric layer on said passivation layer; and m) patterning said dielectric layer and said passivation layer; thereby extending said fuse window through said passivation layer.

2. The method of claim 1 wherein said polysilicon fuse is buried within said InterLevel Dielectric Layer at a depth of between about 1 $\mu$m and 2 $\mu$m.

3. The method of claim 1 wherein said anti-reflective coating is composed of TiN having a thickness in the range between 1000 Å and 1500 Å.

4. The method of claim 1 wherein said InterMetal Dielectric layer is composed of silicon dioxide having a thickness in the range between 5,000 Å and 10,000 Å.

5. The method of claim 1 wherein, following step e, said InterLevel Dielectric layer in said fuse window opening has a depth of between about 2000 Å and 4000 Å; and said via hole extends into said anti-reflective coating to a depth in the range between about 50 Å and 200 Å.

6. The method of claim 1 wherein said fuse window opening has a width in the range between 10 $\mu$m and 20 $\mu$m.

7. The method of claim 1 wherein said adhesion layer (26) is composed of TiN having a thickness in the range between 500 Å and 1000 Å.

8. The method of claim 1 wherein said Tungsten layer (28) has a thickness in the range between 5,000 Å and 10,000 Å.

9. The method of claim 1 wherein said W-ring has a thickness in the range between 500 Å and 1000 Å.

10. A method for simultaneous fabrication of an interlevel metal contact and a fuse window consisting of the steps of:

a) providing a semiconductor substrate having an InterLevel Dielectric layer; said substrate having a device area with a first metal layer over said InterLevel Dielectric layer and a fuse area with a polysilicon fuse buried within said InterLevel Dielectric layer at a depth of at least 1 $\mu$m;

b) forming an anti-reflective coating on said first metal layer;

c) patterning said first metal layer and said anti-reflective coating to form a first metal line;

d) forming an InterMetal Dielectric layer over said InterLevel Dielectric layer and said first metal line;

e) patterning said InterMetal Dielectric layer, said InterLevel Dielectric layer, and said anti-reflective coating to simultaneously open a via hole extending partially into the anti-reflective coating and a fuse window opening extending into said InterLevel Dielectric layer to a depth less than half the depth of said fuse; said fuse window having sidewalls and bottoms;

f) forming an adhesion layer over said InterMetal Dielectric layer, said anti-reflective coating, and said InterLevel Dielectric;

g) blanket depositing a Tungsten layer on said adhesion layer;

h) anisotropically etching said Tungsten layer; said etch stopping on said adhesion layer; thereby forming a W-plug in said via hole and a W-ring on said sidewalls of said fuse window opening; said W-ring having an inside wall;

i) forming an upper metal layer on said adhesion layer, said W-plug, and said W-ring;

j) patterning said upper metal layer using an anisotropic etch to form an upper metal line contacting said W-plug; said anisotropic etch forming an upper metal ring on said inside wall of said W-ring;

k) forming a passivation layer over said upper metal layer, said InterMetal Dielectric layer, and said InterLevel Dielectric layer;

l) forming a dielectric layer on said passivation layer; and m) patterning said dielectric layer and said passivation layer; thereby extending said fuse window through said passivation layer without exposing said fuse.

11. The method of claim 10 wherein said polysilicon fuse is buried within said InterLevel Dielectric Layer at a depth of between 1 $\mu$m and 2 $\mu$m.

12. The method of claim 10 wherein said anti-reflective coating is composed of TiN having a thickness in the range between 1000 Å and 1500 Å.

13. The method of claim 10 wherein said InterMetal Dielectric layer is composed of silicon dioxide having a thickness in the range between 5,000 Å and 10,000 Å.

14. The method of claim 10 wherein, following the etch of step e, said InterLevel Dielectric layer in said fuse window opening has a depth of between about 2000 Å and 4000 Å, and following the etch of step m said InterLevel Dielectric layer in said fuse window opening has a depth of between about 0 and 2000 Å.

15. The method of claim 10 wherein said via hole (22) has a width in the range between 0.3 μm and 1 μm and said fuse window opening has a width in the range between 10 μm and 20 μm.

16. The method of claim 10 wherein said adhesion layer is composed of TiN having a thickness in the range between 500 Å and 1000 Å.

17. The method of claim 10 wherein said Tungsten layer has a thickness in the range between 5,000 Å and 10,000 Å.

18. The method of claim 10 wherein said W-ring has an thickness in the range between 50 Å and 1000 Å.

\* \* \* \* \*